US009070766B1

(12) United States Patent
Chan et al.

(10) Patent No.: US 9,070,766 B1
(45) Date of Patent: Jun. 30, 2015

(54) SEMICONDUCTOR DEVICE AND METHOD OF FORMING THE SAME

(71) Applicant: MACRONIX International Co., Ltd., Hsinchu (TW)

(72) Inventors: Ching-Lin Chan, Hsinchu (TW); Cheng-Chi Lin, Hsinchu (TW); Shih-Chin Lien, Hsinchu (TW); Shyi-Yuan Wu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/165,059

(22) Filed: Jan. 27, 2014

(51) Int. Cl.
*H01L 29/66* (2006.01)
*H01L 29/78* (2006.01)
*H01L 29/739* (2006.01)
*H01L 29/06* (2006.01)
*H01L 29/08* (2006.01)

(52) U.S. Cl.
CPC ........ *H01L 29/7823* (2013.01); *H01L 29/7393* (2013.01); *H01L 29/0649* (2013.01); *H01L 29/0619* (2013.01); *H01L 29/0869* (2013.01); *H01L 29/66681* (2013.01); *H01L 29/66325* (2013.01)

(58) Field of Classification Search
CPC ............ H01L 29/7823; H01L 29/7393; H01L 29/0869; H01L 29/0619; H01L 29/66681; H01L 29/66325; H01L 29/0649
USPC .................. 257/409, 339, 401, 316, 213, 288; 438/142, 151, 294, 286, 197
See application file for complete search history.

(56) References Cited

U.S. PATENT DOCUMENTS

| 5,595,921 | A * | 1/1997 | Villa et al. ..................... 438/286 |
| 5,633,185 | A * | 5/1997 | Yiu et al. ...................... 438/258 |
| 7,576,391 | B2 * | 8/2009 | Williams et al. ............... 257/335 |
| 7,768,071 | B2 * | 8/2010 | Huang et al. ................... 257/355 |
| 7,960,786 | B2 * | 6/2011 | Huang et al. ................... 257/341 |
| 8,890,244 | B2 * | 11/2014 | Lin et al. ........................ 257/342 |
| 8,928,095 | B2 * | 1/2015 | Chen et al. ..................... 257/408 |
| 2009/0085101 | A1 * | 4/2009 | Huang et al. .................. 257/328 |
| 2010/0006935 | A1 * | 1/2010 | Huang et al. ................... 257/341 |
| 2011/0140201 | A1 * | 6/2011 | Lin et al. ....................... 257/342 |

* cited by examiner

*Primary Examiner* — Nikolay Yushin
(74) *Attorney, Agent, or Firm* — J.C. Patents

(57) ABSTRACT

Provided is a semiconductor device including a substrate, an isolation structure, a gate structure, source and drain regions and a conductive layer. The source and drain regions are disposed in the substrate. The isolation structure is disposed between the source and drain regions. The gate structure is disposed on the substrate between the source and drain regions. The conductive layer is disposed on the substrate, extends from above the source region to above the isolation structure and is electrically connected to the source region. The substrate has first and second areas. The source region in the second area has a border curvature greater than that in the first area. The width of the portion of the conductive layer covering the isolation structure in the second area has a width greater than that in the first area.

12 Claims, 7 Drawing Sheets

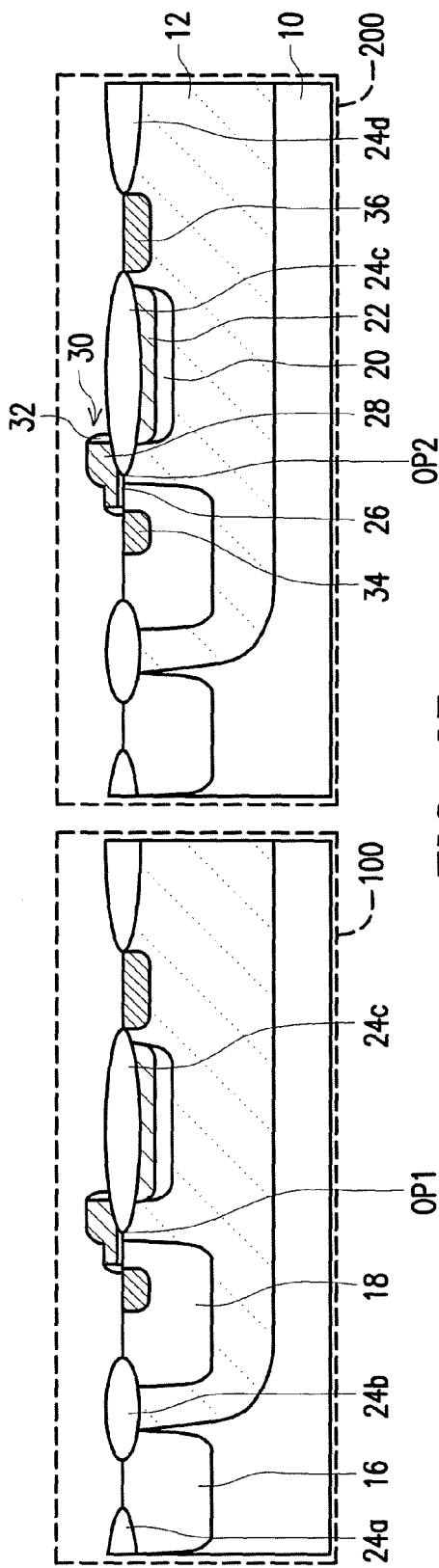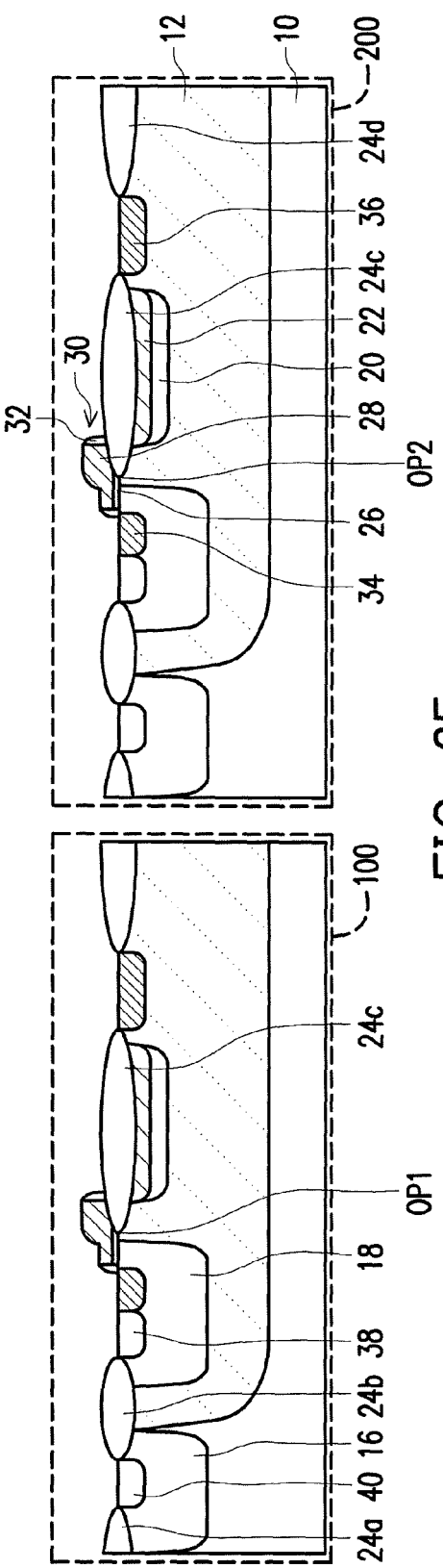

SEMICONDUCTOR DEVICE AND METHOD OF FORMING THE SAME

BACKGROUND OF THE INVENTION

1. Field of Invention

The present invention relates to a semiconductor device and a method of forming the same.

2. Description of Related Art

In order to reduce the power loss of the device, an ultra-high voltage device is required to have a high breakdown voltage and a low on-state resistance (Ron) during operation. Currently, in the existing ultra-high voltage device, the current crowding effect is often observed at the source terminal and a breakdown point is therefore generated. As a result, the breakdown voltage of the device is decreased, and the leakage current of the same is very high.

SUMMARY OF THE INVENTION

The present invention is directed to a semiconductor device and a method of forming the same, in which a semiconductor device is provided with a high breakdown voltage and a low leakage current.

The present invention provides a semiconductor device including a substrate, a source region and a drain region, an isolation structure, a gate structure and a conductive layer. The source and drain regions have a first conductivity type and are disposed in the substrate. The isolation structure is disposed between the source region and the drain region. The gate structure is disposed on the substrate between the source region and the drain region. The conductive layer is disposed on the substrate, at least extends from above the source region to above the isolation structure, and is electrically connected to the source region. The substrate includes a first area and the second area, a border curvature of the source region in the second area is greater than a border curvature of the source region in the first area, and a width of the a portion of the conductive layer covering the isolation structure in the second area is greater than a width of another portion of the conductive layer covering the isolation structure in the first area.

According to an embodiment of the present invention, the conductive layer is an upmost metal layer.

According to an embodiment of the present invention, the semiconductor device includes a plurality of straight-line regions and a plurality of curved regions, one of the straight-line regions is located in the first area, and one of the curved regions is located in the second area.

According to an embodiment of the present invention, the source region has a racetrack shape or a U-shape.

According to an embodiment of the present invention, the semiconductor device further includes a top layer having a second conductivity type and disposed in the substrate below the isolation structure, and a grade layer having the first conductivity type and disposed between the top layer and the isolation structure.

According to an embodiment of the present invention, the semiconductor device further includes: a first well region, having a second conductivity type and disposed in the substrate, wherein the source regions is located in the first well region, and the gate structure covers a portion of the first well region; a doped region, having the second conductivity type and disposed in the first well region adjacent to the source region, wherein the doped region and the source region are connected to the conductive layer; and a second well region, having the first conductivity type and disposed in the substrate, wherein the first well region and the drain region are located in the second well region.

The present invention further includes a method of forming a semiconductor device. An isolation structure is formed on a substrate. A gate structure is formed on the substrate. Source and drain regions having a first conductivity type are formed in a substrate beside the gate structure and the isolation structure, wherein the source region is approximate to the gate structure, and the drain region is approximate to the isolation structure. A conductive layer is formed on the substrate, wherein the conductive layer extends from above the source region to above the isolation structure and is electrically connected to the source region. The substrate includes a first area and the second area, a border curvature of the source region in the second area is greater than a border curvature of the source region in the first area, and a width of the a portion of the conductive layer covering the isolation structure in the second area is greater than a width of another portion of the conductive layer covering the isolation structure in the first area.

According to an embodiment of the present invention, the conductive layer is an upmost metal layer.

According to an embodiment of the present invention, the semiconductor device includes a plurality of straight-line regions and a plurality of curved regions, one of the straight-line regions is located in the first area, and one of the curved regions is located in the second area.

According to an embodiment of the present invention, the source region has a racetrack shape or a U-shape.

According to an embodiment of the present invention, the method further includes forming a top layer having a second conductivity type in the substrate below the isolation structure; and forming a grade layer of the first conductivity type between the top layer and the isolation structure.

According to an embodiment of the present invention, the method further includes: forming a first well region having a second conductivity type in the substrate, wherein the source regions is located in the first well region, and the gate structure covers a portion of the first well region; forming a doped region having the second conductivity type in the first well region adjacent to the source region, wherein the doped region and the source region are connected to the conductive layer; and forming a second well region having the first conductivity type in the substrate, wherein the first well region and the drain region are located in the second well region.

In view of the above, in the semiconductor device of the invention, the conductive layer (e.g. topmost metal layer) is designed to have different widths according to the border curvatures of the source region, so as to dissipate the high electric field at a more curved or corner region. Therefore, the breakdown voltage of the device is increased, and the leakage current of the same is reduced.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A to FIG. 2G illustrates cross-sectional views of a method of forming a semiconductor device according to an embodiment of the present invention, in which FIG. 2G illustrates two cross-sectional views taken along the lines I-I and II-II of FIG. 1.

DESCRIPTION OF EMBODIMENTS

Figure 1:
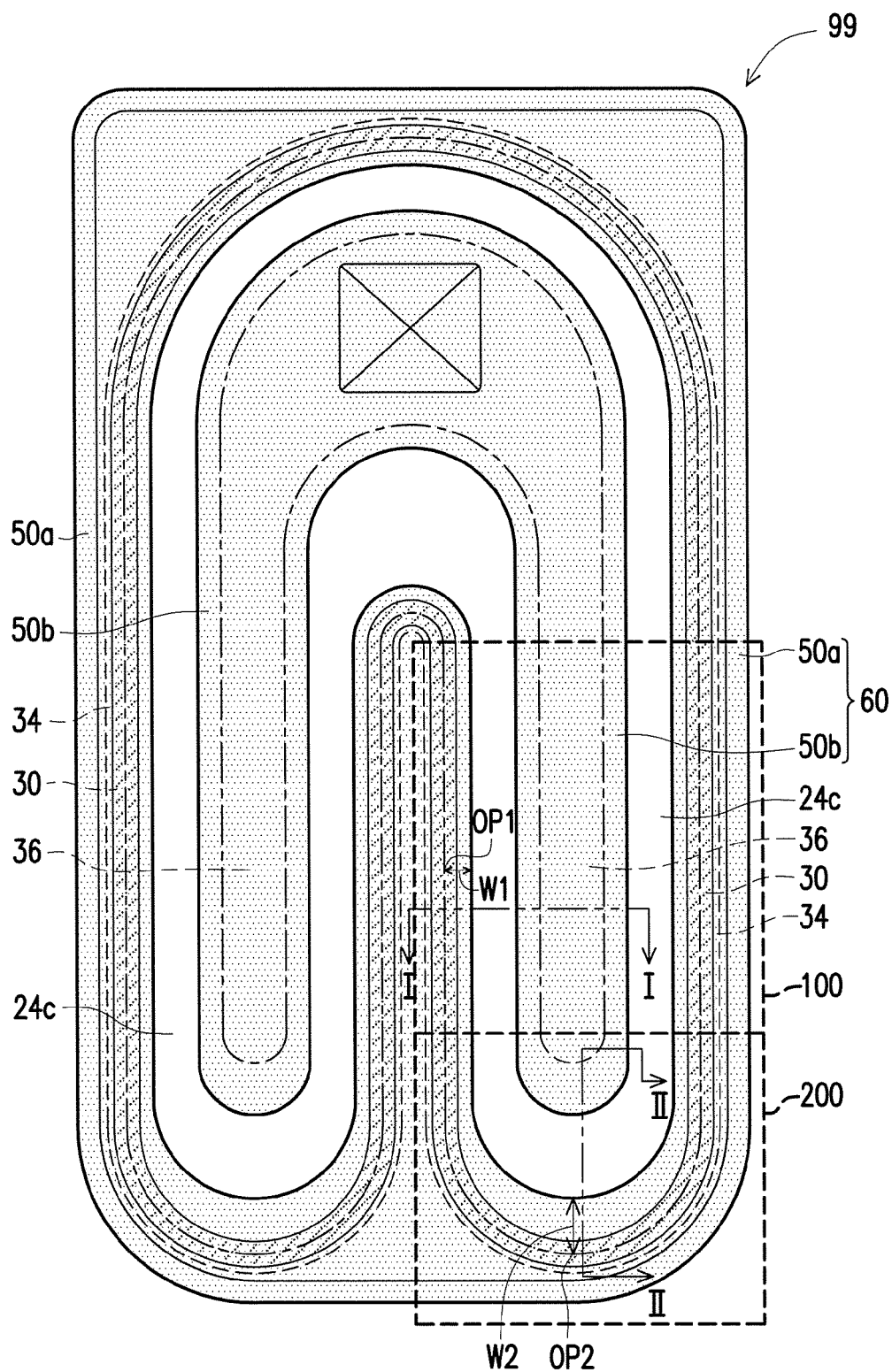
FIG. 1 illustrates a top view of a semiconductor device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The concept of the invention can be applied to a semiconductor device having a curved region in its source region, for example but not limited to, a semiconductor device having a racetrack-shaped source region or a U-shaped source region. In the semiconductor device of the invention, the conductive layer (e.g. topmost metal layer) is designed to have different widths according to the border curvatures of the source region, so as to dissipate the high electric field at a more curved or corner region. Therefore, the breakdown voltage of the device is increased, and the leakage current of the same is reduced. The following embodiment in which a semiconductor device has a U-shaped source region is provided for illustration purposes, and is not construed as limiting the present invention.

FIG. 1 illustrates a top view of a semiconductor device according to an embodiment of the present invention. FIG. 2G illustrates two cross-sectional views taken along the lines I-I and II-II of FIG. 1.

In the following embodiment, the first conductivity type is N-type, and the second conductivity is P-type. The P-type dopant includes boron, and the N-type dopant includes phosphor or arsenic. However, the present invention is not limited thereto. In another embodiment, the first conductivity type can be P-type and the second conductivity type can be N-type.

Referring to FIG. 1 and FIG. 2G, the semiconductor device 99 of the present invention can be a high voltage device, an ultra-high voltage device having an operation voltage of 300 to 1,000 V, a power device, a laterally diffused metal oxide semiconductor (LDMOS) or an insulated-gate bipolar transistor (IGBT). The semiconductor device 99 includes a substrate 10, isolation structures 24a to 24d, a gate structure 30, a source region 34, a drain region 36 and a metal interconnection 60 including conductive layers 50a, 50b, etc. The semiconductor device 99 of the invention can further include well regions 12, 16 and 18, a top layer 20, a grade layer 22 and doped regions 38 and 40.

The substrate 10 can be a semiconductor substrate having a second conductivity type, such as a P-type substrate. The semiconductor substrate can include at least one material selected from the group consisting of Si, Ge, SiGe, GaP, GaAs, SiC, SiGeC, InAs and InP. The substrate 10 can be a silicon-on-insulator (SOI) substrate. The substrate 10 can also be an epitaxial wafer having the second conductivity type, such as a P-type epitaxial (P-epi) wafer.

In an embodiment, the semiconductor device 99 includes a plurality of straight-line regions and a plurality of curved regions, but the present invention is not limited thereto. In this embodiment, the first area 100 of the substrate 10 can be a straight-line region where the source region 34 has a less border curvature or zero curvature, and the second area 200 of the substrate 10 can be a curved region where the source region 34 has a greater border curvature.

The well region 12 has the first conductivity type and is disposed in the substrate 10. The well region 12 can be an N-type well region or called a high voltage N-well (HVNW). The well regions 16 and 18 have the second conductivity type and can be P-type well regions. The well region 16 is disposed in the substrate 10 adjacent to the well region 12. The well region 18 is disposed in the well region 12.

The isolation structures 24a to 24d are disposed on the substrate 10. Specifically, the isolation structure 24a covers a portion of the well region 16. The isolation structure 24b covers another portion of the well region 16 and extends to cover a portion of the well regions 12 and 16. The isolation structures 24c and 24d are disposed on a portion of the well region 12 at one side of the well region 18. The isolation structure 24c is disposed between the well region 18 and the isolation structure 24d. Each of the isolation structures 24a to 24d includes an insulating material, such as undoped silicon oxide, silicon nitride or a combination thereof.

The gate structure 30 includes a gate dielectric layer 26 and a gate conductive layer 28. The gate structure 30 is disposed on the substrate 12 and covers a portion of the well regions 18 and 12. The gate structure 30 can extend onto the isolation structure 24c. A spacer 32 can be disposed on the sidewall of the gate structure 30. The spacer 32 includes silicon oxide, silicon nitride or a combination thereof.

The source region 34 and the drain region 36 have the first conductivity type and can be $N^+$ source and drain regions. The source and drain regions 34 and 36 are disposed in the substrate 10 beside the gate structure 30 and the isolation structure 24c, wherein the source region 34 is approximate to the gate structure 30, and the drain region 36 is approximate to the isolation structure 24c. Specifically, the source region 34 is disposed in the well region 18 at one side of the gate structure 30. The drain region 36 is disposed in the well region 12 between the isolation structures 24c and 24d. The source and drain regions 34 and 36 have a doping concentration of $1 \times 10^{14}/cm^2$ to $9 \times 10^{16}/cm^2$, for example.

The doped regions 38 and 40 have the second conductivity type and can be P-type heavily doped ($P^+$) regions. The doped region 38 is disposed in the well region 18 between the isolation structure 24b and the source region 34. The doped region 40 is disposed in the well region 16. The doped regions 38 and 40 have a doping concentration of $1 \times 10^{14}/cm^2$ to $9 \times 10^{16}/cm^2$, for example.

The top layer 20 has the second conductivity type and can be a P-type top (P-top) layer. The top layer 20 is disposed in the well region 12 below the isolation structure 24c for increasing the breakdown voltage. The grade layer 22 has the first conductivity type and can be an N-type grade (N-grad) layer disposed between the top layer 20 and the isolation structure 24c for reducing the on-state resistance. The grade layer 22 has a doping concentration no less than that of the well region 12. The top layer 20 has a doping concentration of $1 \times 10^{11}/cm^2$ to $9 \times 10^{13}/cm^2$, for example. The grade layer 22 has a doping concentration of $1 \times 10^{11}/cm^2$ to $9 \times 10^{13}/cm^2$, for example.

In an embodiment, the metal interconnection 60 includes, for example but not limited to, a dielectric layer 42, contacts 44a to 44e, conductive layers (or called first metal layers) 46a to 46d, a dielectric layer 48, vias 52a to 52b and conductive layers (or called top metal layers) 50a to 50b. In another embodiment, the metal interconnection 60 can further include a plurality of conductive layers (or called metal layers) and a plurality of vias disposed between the conductive layers 46a-46d and the conductive layers 50a-50b. The conductive layer 46a is electrically connected to the doped region 40 through the contact 44a. The conductive layer 46b is electrically connected to the doped region 38 and the source region 34 respectively through the contacts 44b and 44c. The conductive layer 46c is electrically connected to the gate conductive layer 28 through the contact 44d. The conductive layer 46d is electrically connected to the drain region 36 through the contact 44e.

The conductive layers 50a and 50b can be the topmost metal layers of the metal interconnection 60. The conductive layers 50a and 50b can be electrically connected to the conductive layers 46a to 46d through the vias 52a to 52b. The conductive layer 50a (referred to as a source metal layer) at least extends from above the source region 34 (or the isolation structure 24b) to above the isolation structure 24c and is electrically connected to the source region 34 through the via 52a, the conductive layer 46b and the contact 44c. The conductive layer 50b (referred to as a drain metal layer) at least extends from above the isolation structure 24c to above the isolation structure 24d and is electrically connected to the drain region 36 through the via 52a, the conductive layer 46b and the contact 44e.

Referring to FIG. 1 and FIG. 2G, a portion of the conductive layer 50a covering the isolation structure 24c in the first area 100 has a width W1. The width W1 is a distance from a point of the conductive layer 50a which corresponds to the object point OP1 of the isolation structure 24c to the edge of the conductive layer 50a near the conductive layer 50b in the first area 100. Another portion of the conductive layer 50a covering the isolation structure 24c in the second area 200 has a width W2. The width W2 is a distance from a point of the conductive layer 50a which corresponds to the object point OP2 of the isolation structure 24c to the edge of the conductive layer 50a near the conductive layer 50b in the second area 200. In this embodiment, the width W1 of the another portion of the conductive layer 50a in the second area 200 is greater than the width W2 of the portion of the conductive layer 50a in the first area 100; that is, W2>W1. The width W2 is about 1.5 to 5 times the width W1, for example.

In the top view of FIG. 1, the border curvature of the source region 34 is gradually increased from the area 100 to the area 200. In this embodiment, the width of the portion of the conductive layer 50a covering the isolation structure 24c is also gradually and smoothly increased from the area 100 to the area 200; that is, the conductive layer 50a has a smooth border as shown in FIG. 1. In another embodiment (not shown), the width of the portion of the conductive layer 50a covering the isolation structure 24c can also be gradually and stepwise increased from the area 100 to the area 200; that is, the conductive layer 50a has a stepped border.

The said embodiment in which the first area 100 of the substrate 10 is a straight-line region of the semiconductor device 99 and the second area 200 of the substrate 10 is a curved region of the semiconductor device 99 are provided for illustration purposes, and is not construed as limiting the present invention. As long as the source region 34 of the semiconductor device 99 has a border curvature in the first area 100 less than that in the second area 200, such semiconductor device falls within the scope of the present invention.

FIG. 2A to FIG. 2G illustrates cross-sectional views of a method of forming a semiconductor device according to an embodiment of the present invention.

Figure 2A:
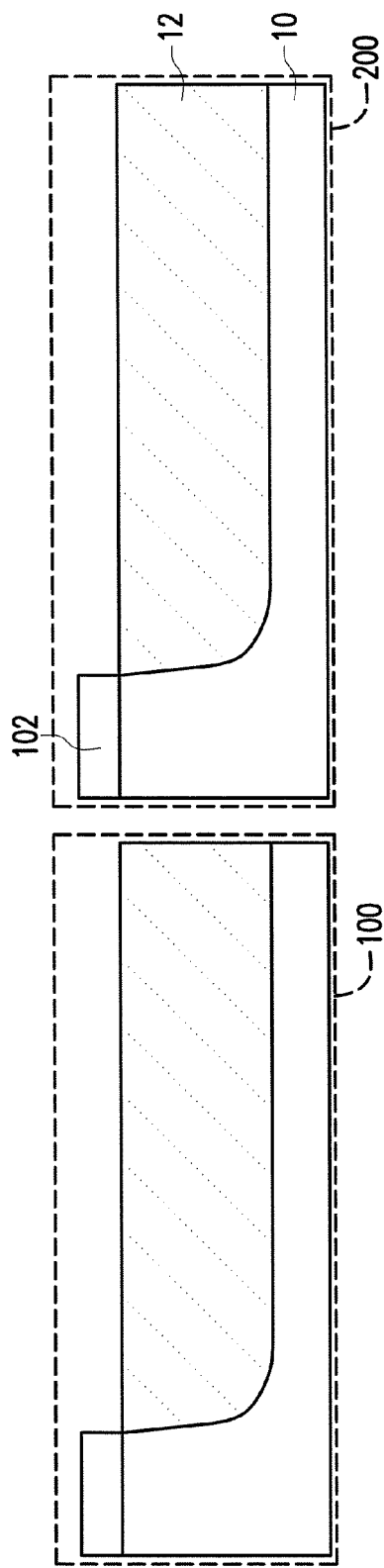

Referring to FIG. 2A, a substrate 10 having a first area 100 and a second area 200 is provided. Thereafter, a patterned mask layer 102 is formed on the substrate 10. The patterned mask layer 102 includes a photoresist or a dielectric material. Afterwards, an ion implantation process is performed by using the patterned mask layer 102 as an implant mask, so as to form a well region 12 having a first conductivity type in the substrate 10. The well region 12 can be an N-type well region. In the ion implantation process, the dopant includes phosphor or arsenic, the doping dose ranges from $1 \times 10^{11}/cm^2$ to $9 \times 10^{13}/cm^2$, and the implanting energy ranges from 50 KeV to 200 KeV, for example.

Figure 2B:
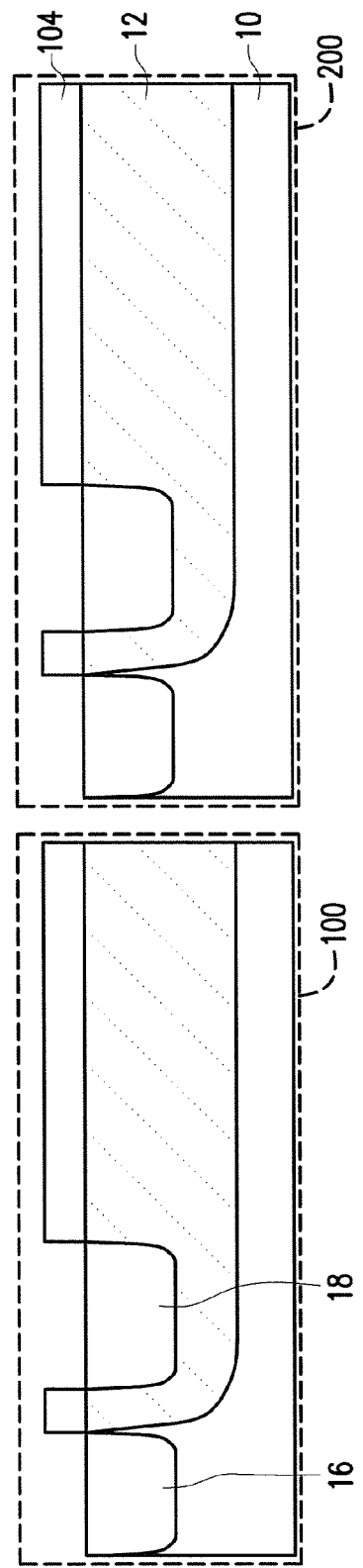

Referring to FIG. 2B, the patterned mask layer 102 is removed. Thereafter, a patterned mask layer 104 is formed on the substrate 10. The patterned mask layer 104 includes a photoresist or a dielectric material. Afterwards, an ion implantation process is performed by using the patterned mask layer 104 as an implant mask, so as to form well region 16 and 18 having a second conductivity type in the substrate 10. The well regions 16 and 18 can be P-type well regions. In the ion implantation process, the dopant includes boron, the doping dose ranges from $1 \times 10^{11}/cm^2$ to $9 \times 10^{13}/cm^2$, and the implanting energy ranges from 50 KeV to 200 KeV, for example.

Figure 2C:
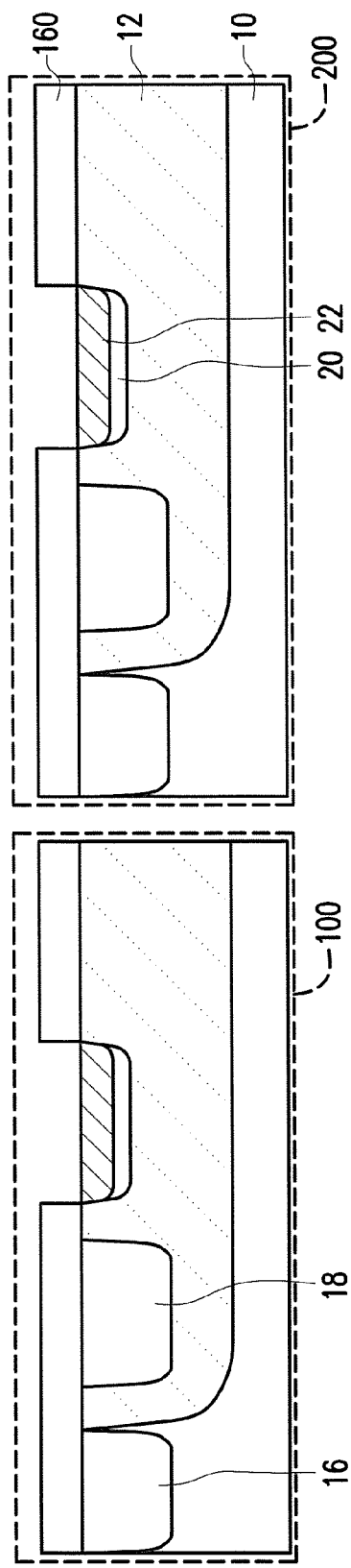

Referring to FIG. 2C, the patterned mask layer 104 is removed. Thereafter, a patterned mask layer 106 is formed on the substrate 10. The patterned mask layer 106 includes a photoresist or a dielectric material. Afterwards, an ion implantation process is performed by using the patterned mask layer 106 as an implant mask, so as to form a top layer 20 having the second conductivity type in the substrate 10. The top layer 20 can be a P-type top layer. In the ion implantation process, the dopant includes boron, the doping dose ranges from $1 \times 10^{11}/cm^2$ to $9 \times 10^{13}/cm^2$, and the implanting energy ranges from 50 KeV to 200 KeV, for example.

Continue referring to FIG. 2C, another ion implantation process is performed by using the patterned mask layer 106 as an implant mask, so as to form a grade layer 22 having the first conductivity type in the substrate 10. The grade layer 22 can be an N-type grade layer. In the another ion implantation process, the dopant includes phosphor or arsenic, the doping dose ranges from $1 \times 10^{11}/cm^2$ to $9 \times 10^{13}/cm^2$, and the implanting energy ranges from 50 KeV to 200 KeV, for example.

Figure 2D:
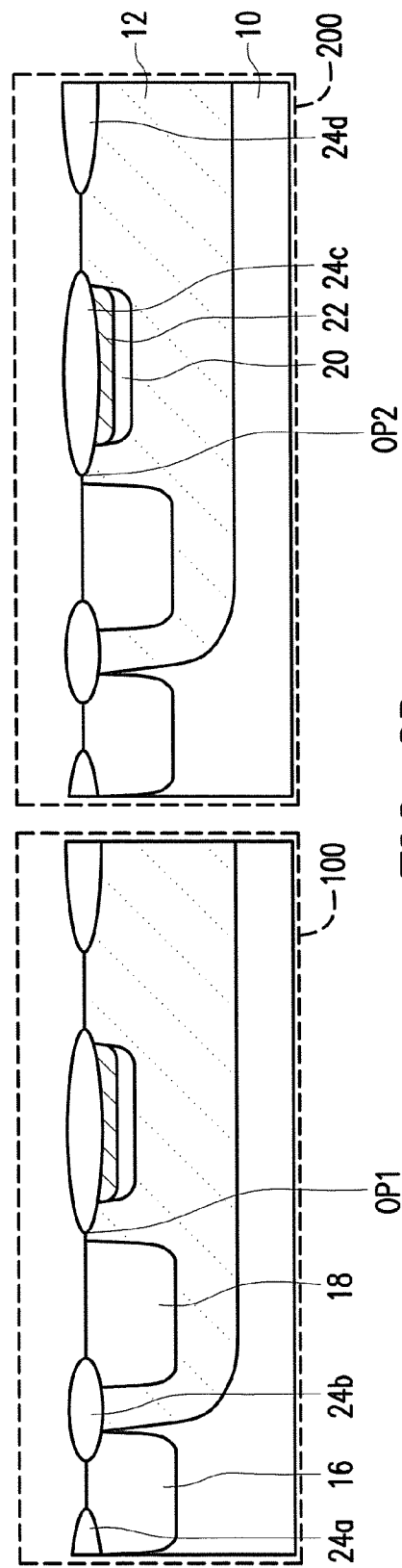
Figure 2G:
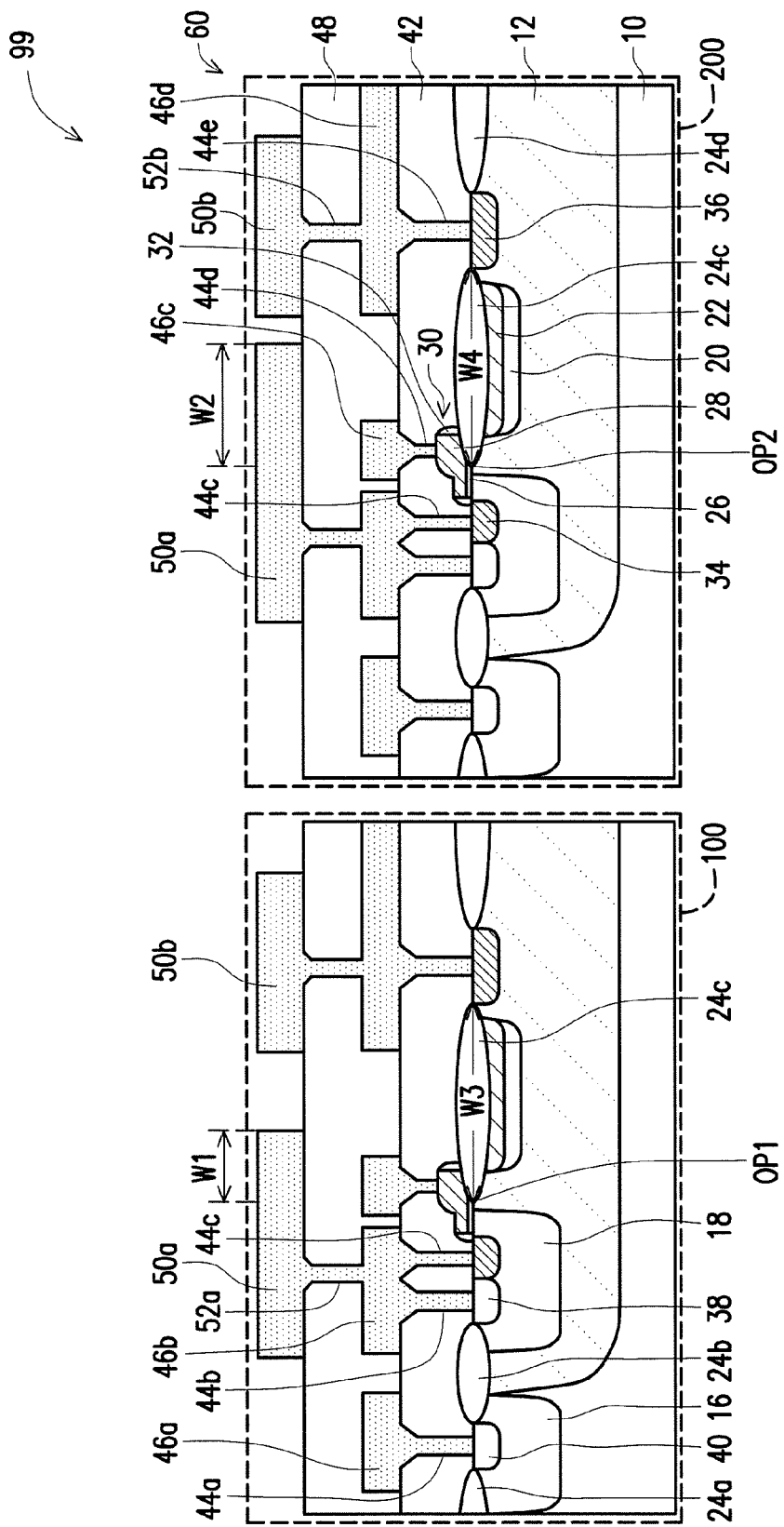

Referring to FIG. 2D, the patterned mask layer 106 is removed. Thereafter, isolation structures 24a to 24d are formed to define active areas. The isolation structures 24a to 24d include undoped silicon oxide, and can be formed with a field oxide isolation process or a shallow trench isolation process. The isolation structures 24a to 24d have a thickness of 100 nm to 800 nm, for example.

Referring to FIG. 2E, a gate structure 30 is formed on the substrate 10 adjacent to the isolation structure 24c. In an embodiment, the gate structure 30 further extends onto a portion of the isolation structure 24c. The gate structure 30 includes a gate dielectric layer 26 and a gate conductive layer 28. The gate dielectric layer 26 includes a high-k or low-k material. The low-k material is referred to as a dielectric material having a dielectric constant less than 4, such as silicon oxide or silicon oxynitride. The high-k material is referred to as a dielectric material having a dielectric constant greater than 4, such as HfAlO, $HfO_2$, $Al_2O_3$ or $Si_3N_4$. The gate dielectric layer 26 can be formed with a thermal oxide process or a chemical vapour deposition process. The gate conductive layer 28 includes polysilicon, metal, metal silicide or a combination thereof. The gate conductive layer 28 can be formed with a chemical vapour deposition process.

Thereafter, a spacer 32 is formed on the sidewall of the gate structure 30. The spacer 32 includes silicon oxide, silicon nitride or a combination thereof. The method of forming the spacer 32 includes forming a spacer material layer and then performing an anisotropic etching process to the spacer material layer.

Afterwards, a source region 34 having the first conductivity type is formed in the well region 18 at one side of the gate structure 30, and a drain region 36 is formed in the well region 12 at the other side of the gate structure 30 (or the isolation structure 24c). The method of forming the source and drain regions 34 and 36 includes forming a patterned mask layer (not shown) and then performing an ion implantation process. The source and drain regions 34 and 36 can be N-type heavily doped regions. In the ion implantation process, the dopant includes phosphor or arsenic, the doping dose ranges from $1 \times 10^{14}/cm^2$ to $9 \times 10^{16}/cm^2$, and the implanting energy ranges from 50 KeV to 200 KeV, for example.

Referring to FIG. 2F, a doped region 38 having the second conductivity type is formed in the well region 18, and a doped region 40 having the second conductivity type is formed in the well region 16. The method of forming the doped regions 38 and 40 includes forming a patterned mask layer (not shown) and then performing an ion implantation process. The doped regions 38 and 40 can be P-type doped regions. In the ion implantation process, the dopant includes boron, the doping dose ranges from $1 \times 10^{14}/cm^2$ to $10^{16}/cm^2$, and the implanting energy ranges from 50 KeV to 200 KeV, for example.

Referring to FIG. 2G, a metal interconnection 60 is formed on the substrate 10. In this embodiment, the metal interconnection 60 includes, for example but not limited to, a dielectric layer 42, contacts 44a to 44e, conductive layers (or called first metal layers) 46a to 46d, a dielectric layer 48, vias 52a to 52b and conductive layers (or called top metal layers) 50a to 50b. In an embodiment, the method of forming the metal interconnection 60 includes the following steps. The dielectric layer 42 is formed on the substrate 10. The conductive layers 46a to 46d are formed on the dielectric layer 42. Thereafter, the contacts 44a to 44e are formed in the dielectric layer 42. Afterwards, the dielectric layer 48 is formed on the substrate 10. Then, the vias 52a to 52b are formed in the dielectric layer 48. Next, the conductive layers (or called top metal layers) 50a to 50b is formed on the dielectric layer 48. The dielectric layers 42 and 48 include silicon oxide, silicon nitride, silicon oxynitride or a low-k dielectric material having a dielectric constant less than 4, and can be formed with at least one chemical vapour deposition process or spin coating process. The contacts 44a to 44e and the vias 52a to 52b include aluminium, tungsten or an alloy thereof, and can be formed with at least one chemical or physical vapour deposition process. The method of forming the contacts 44a to 44e includes forming contact openings in the dielectric layer 42, depositing a conductive material layer in the contact openings, and removing a portion of the conductive material layer on the dielectric layer 42 outside the contact openings. The forming method of the vias 52a to 52b is similar to that of the contacts 44a to 44e, and the details are not iterated herein. The method of forming the conductive layers 46a to 44d or the conductive layers 50a to 50b includes forming at least one conductive material layer and then patterning the conductive material layer. The at least one conductive material layer includes metal or metal alloy, such as aluminium, tungsten or an alloy thereof. The at least one conductive material layer can be formed with at least one chemical or physical vapour deposition process. The method of forming the metal interconnection 60 is not limited by the above-described manner.

In another embodiment, the metal interconnection 60 can be formed with a metal damascene process.

After the formation of the metal interconnection 60, a protection layer (not shown) is further formed on the substrate 10 to cover the conductive layers 50a to 50b and the dielectric layer 48. The protection layer can be a single-layer or multi-layer structure. The protection layer includes an inorganic material, an organic material or a combination thereof. The inorganic material includes silicon oxide, silicon nitride or a combination thereof. The organic material includes polyimide (PI).

Figure 3:
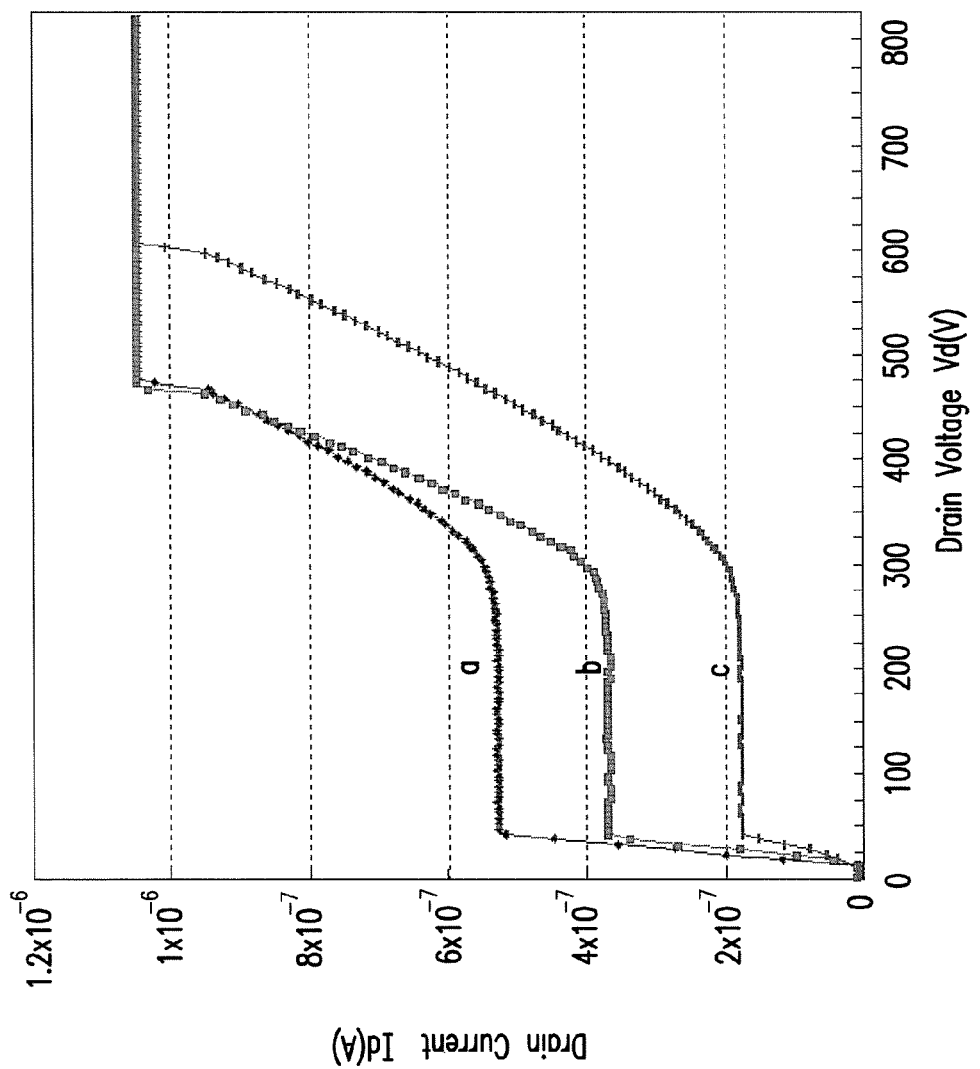
FIG. 3 is a graph illustrating leakage current curves of three semiconductor devices during the ESD 2 kV test, in which portions of conductive layers covering isolation structures have different widths in respective source terminals of the devices.
Figure 4:
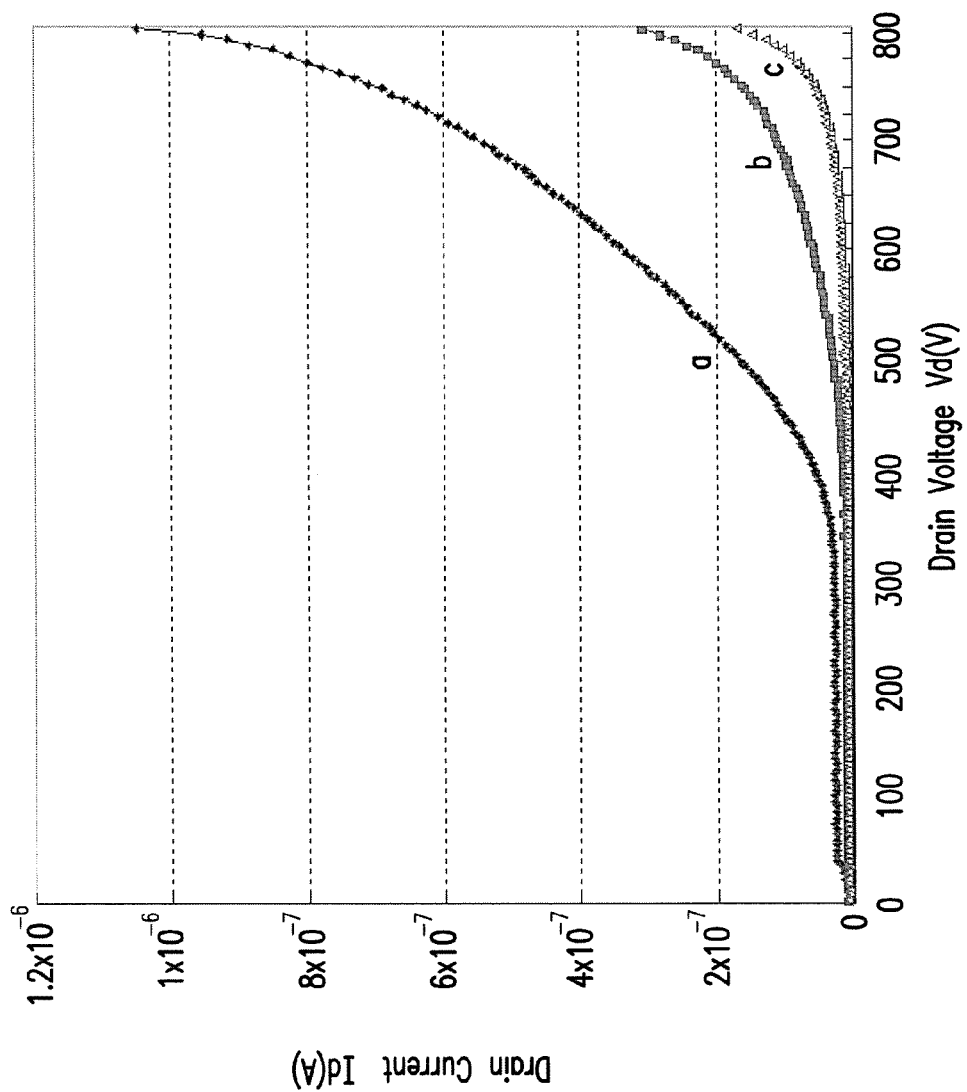
FIG. 4 is a graph illustrating breakdown voltage curves of three semiconductor devices during the ESD 2 kV test, in which portions of conductive layers covering isolation structures have different widths in respective source terminals of the devices.

FIG. 3 and FIG. 4 are graphs respectively illustrating leakage current curves and breakdown voltage curves of three semiconductor devices during the ESD 2 kV test, in which portions of conductive layers 50a covering isolation structures 24c have different widths W2 in respective curved regions (e.g. the second areas 200 in FIG. 2G) of the devices. The widths W2 of the semiconductor devices are respectively a, b and c, wherein a<b<c.

As shown in the experiment results, when the portion of the conductive layer covering the corresponding isolation structure has a greater width at the source terminal, the leakage current of the device is decreased and the breakdown voltage of the same is increased. In other words, the 700 V semiconductor device of the invention can pass the ESD 2 keV test, as along as the width of the portion of the conductive layer covering the isolation structure at the source terminal is adjusted to an optimum value. In the actual application, the structure of the invention can be applied to an ultra-high voltage device having an operation voltage of 300 to 1,000 V.

In summary, in the present invention, the portions of the conductive layer covering the isolation structure at different areas can be adjusted to have different widths. For example, the conductive layer (e.g. the topmost metal layer) at the more curved or corner region of the source region is designed to have a greater width, while another portion of the conductive layer (e.g. the topmost metal layer) covering the isolation structure at the less curved or straight-line region of the source region is designed to have a less width. In other words, the conductive layer (e.g. the topmost metal layer) is designed to have a greater area at the more curved or corner region of the source region, at which the high electric field can be uniformly distributed. By such disposition, the device can be provided with a higher breakdown voltage, a lower leakage current and an improved ESD protection capability.

In addition, in the method of forming the semiconductor device of the invention, the patterns of the photomask for defining the conductive layer (e.g. the topmost metal layer) can be changed, so that the conductive layer (e.g. the topmost metal layer) can be formed to have a greater width (or area) at the more curved or corner region, at which the high electric field can be uniformly distributed, so as to increase the breakdown voltage, decrease the leakage current, and improve the ESD protection capability of the device.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:
1. A semiconductor device, comprising:
   a source region and a drain region, having a first conductivity type and disposed in a substrate;
   an isolation structure, disposed between the source region and the drain region;

a gate structure, disposed on the substrate between the source region and the drain region;

a conductive layer, disposed on the substrate, at least extending from above the source region to above the isolation structure, and electrically connected to the source region, wherein the substrate comprises a first area and a second area, a border curvature of the source region in the second area is greater than a border curvature of the source region in the first area, and a width of the a portion of the conductive layer covering the isolation structure in the second area is greater than a width of another portion of the conductive layer covering the isolation structure in the first area.

2. The semiconductor device of claim 1, wherein the conductive layer is an upmost metal layer.

3. The semiconductor device of claim 1, wherein the semiconductor device comprises a plurality of straight-line regions and a plurality of curved regions, one of the straight-line regions is located in the first area, and one of the curved regions is located in the second area.

4. The semiconductor device of claim 1, wherein the source region has a racetrack shape or a U-shape.

5. The semiconductor device of claim 1, further comprising:
a top layer, having a second conductivity type and disposed in the substrate below the isolation structure; and
a grade layer, having the first conductivity type and disposed between the top layer and the isolation structure.

6. The semiconductor device of claim 1, further comprising:
a first well region, having a second conductivity type and disposed in the substrate, wherein the source regions is located in the first well region, and the gate structure covers a portion of the first well region;
a doped region, having the second conductivity type and disposed in the first well region adjacent to the source region, wherein the doped region and the source region are connected to the conductive layer; and
a second well region, having the first conductivity type and disposed in the substrate, wherein the first well region and the drain region are located in the second well region.

7. A method of forming a semiconductor device, comprising:
forming an isolation structure on a substrate;
forming a gate structure on the substrate;
forming a source region and a drain region both having a first conductivity type in a substrate beside the gate structure and the isolation structure, wherein the source region is approximate to the gate structure, and the drain region is approximate to the isolation structure;
forming a conductive layer on the substrate, wherein the conductive layer extends from above the source region to above the isolation structure and is electrically connected to the source region,
wherein the substrate comprises a first area and a second area, a border curvature of the source region in the second area is greater than a border curvature of the source region in the first area, and a width of the a portion of the conductive layer covering the isolation structure in the second area is greater than a width of another portion of the conductive layer covering the isolation structure in the first area.

8. The method of claim 7, wherein the conductive layer is an upmost metal layer.

9. The method of claim 7, wherein the semiconductor device comprises a plurality of straight-line regions and a plurality of curved regions, one of the straight-line regions is located in the first area, and one of the curved regions is located in the second area.

10. The method of claim 7, wherein the source region has a racetrack shape or a U-shape.

11. The method of claim 7, further comprising,
forming a top layer having a second conductivity type in the substrate below the isolation structure; and
forming a grade layer of the first conductivity type between the top layer and the isolation structure.

12. The method of claim 7, further comprising:
forming a first well region having a second conductivity type in the substrate, wherein the source regions is located in the first well region, and the gate structure covers a portion of the first well region;
forming a doped region having the second conductivity type in the first well region adjacent to the source region, wherein the doped region and the source region are connected to the conductive layer; and
forming a second well region having the first conductivity type in the substrate, wherein the first well region and the drain region are located in the second well region.

* * * * *